(12) United States Patent
Chang et al.

(10) Patent No.: US 9,653,364 B1
(45) Date of Patent: May 16, 2017

(54) FINFET DEVICE AND METHOD OF FORMING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsunchu (TW)

( * ) Notice: Subject to any disclaimer, the term of this patent is extended or adjusted under 35 U.S.C. 154(b) by 0 days.

(21) Appl. No.: 14/990,796

(22) Filed: Jan. 8, 2016

(51) Int. Cl.
| | |
|---|---|
| H01L 27/088 | (2006.01) |
| H01L 21/8238 | (2006.01) |
| H01L 23/535 | (2006.01) |
| H01L 27/092 | (2006.01) |
| H01L 29/08 | (2006.01) |
| H01L 29/161 | (2006.01) |
| H01L 29/16 | (2006.01) |
| H01L 29/165 | (2006.01) |
| H01L 29/78 | (2006.01) |
| H01L 29/66 | (2006.01) |

(52) U.S. Cl.
CPC ........ *H01L 21/823871* (2013.01); *H01L 21/823814* (2013.01); *H01L 21/823821* (2013.01); *H01L 23/535* (2013.01); *H01L 27/0924* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/785* (2013.01); *H01L 29/7848* (2013.01)

(58) Field of Classification Search
CPC . H01L 29/785; H01L 29/7982; H01L 23/535; H01L 21/31111
USPC ........................................................ 257/401
See application file for complete search history.

(56) References Cited

U.S. PATENT DOCUMENTS

| | | | |
|---|---|---|---|
| 2015/0249036 A1* | 9/2015 | Cai ........... | H01L 27/088 257/382 |
| 2016/0181399 A1* | 6/2016 | Jun ........... | H01L 21/76816 438/294 |

* cited by examiner

*Primary Examiner* — David Vu
*Assistant Examiner* — Brandon Fox
(74) *Attorney, Agent, or Firm* — Jianq Chyun IP Office (57) ABSTRACT

Provided is a FinFET device including a substrate having at least one fin, first and second gate stacks, first and second strained layers, first and second dielectric layers, and first and second connectors. The first and second gate stacks are across the fin. The first and second strained layers are respectively aside the first and second gate stacks. The first and second dielectric layer are respectively over the first and second strained layers, and the top surface of the first dielectric layer is lower than the top surface of the second dielectric layer. The first connector is through the first dielectric layer and is electrically connected to the first strained layer. The second connector is through the second dielectric layer and is electrically connected to the second strained layer. Besides, the width of the second connector is greater than the width of the first connector.

20 Claims, 7 Drawing Sheets

FINFET DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1E are schematic cross-sectional views of a method of forming a FinFET device in accordance with some embodiments.

Figure 1A:
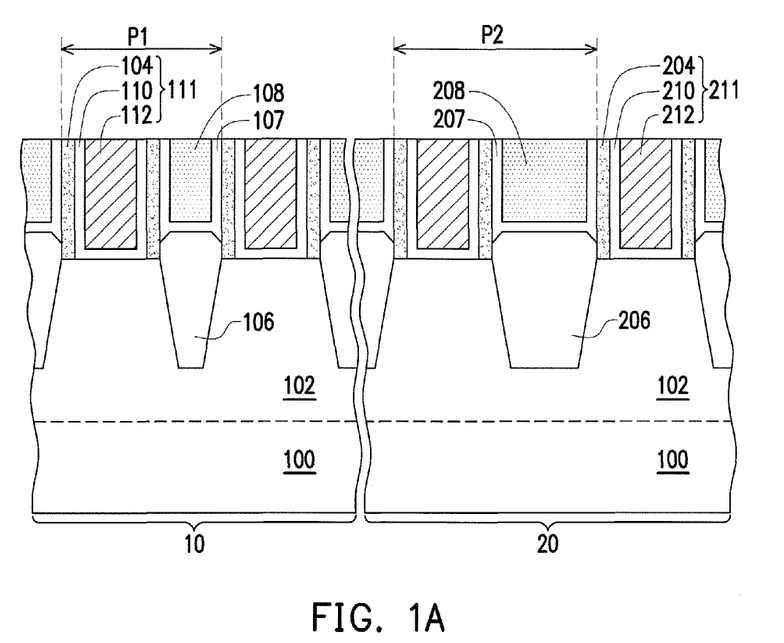
FIG. 1A to FIG. 1E are schematic cross-sectional views of a method of forming a FinFET device in accordance with some embodiments.

Referring to FIG. 1A, a substrate 100 with one or more fins 102 is provided. In some embodiments, the substrate 100 includes a silicon-containing substrate, a silicon-on-insulator (SOI) substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the substrate 100 has an isolation layer formed thereon. Specifically, the isolation layer covers lower portions of the fins 102 and exposes upper portions of the fins 102. In some embodiments, the isolation layer is a shallow trench isolation (STI) structure.

Besides, the substrate 100 has a first region 10 and a second region 20 adjacent to each other. In some embodiments, the first region 10 and the second region 20 have different pattern densities. In some embodiments, the pattern density in the first region 10 is greater than that in the second region 20. In some embodiments, the pitch P1 in the first region 10 is smaller than the pitch P2 in the second region 20. In some embodiments, the pitch is the feature line width plus the intermediate space between feature lines, or defined as the distance between repeated elements. In some embodiments, the pitch is defined as the distance from the first side (e.g., left side) of one gate stack to the first side (e.g., left side) of the next gate stack. In some embodiments, the pitch P1 in the first region 10 is at least about 1.5 times, 2 times or 20 times smaller the pitch P2 in the second region 20. In some embodiments, the pitch P1 is no more than about 14 nm or no more than about 10 nm, for example.

In some embodiments, the substrate 100 has, in the first region 10, at least two first gate stacks 111 formed thereon, first strained layers 106 formed therein and a first dielectric layer 108 formed aside the first gate stacks 111 and over the first strained layers 106. In some embodiments, the substrate 100 has, in the second region 20, at least two second gate stacks 211 formed thereon, second strained layers 206 formed therein and a second dielectric layer 208 formed aside the second gate stacks 211 and over the second strained layers 206.

In some embodiments, each of the first gate stacks 111 is defined to include a first metal gate 112, a first gate dielectric layer 110 between the first metal gate 112 and the substrate 100, and a first spacer 104 on the sidewall of the first metal gate 112. In some embodiments, each of the second gate stacks 211 is defined to include a second metal gate 212, a second gate dielectric layer 210 between the second metal gate 212 and the substrate 100, and a second spacer 204 on the sidewall of the second metal gate 212.

In some embodiments, the method of forming the intermediate structure in the first region 10 of FIG. 1A includes forming at least two first dummy gate stacks across the fins 102, forming first spacers 104 on the sidewalls of the first dummy gate stacks, forming first strained layers 106 at two sides of each fin 102, forming a first dielectric layer 108 aside the first dummy gate stacks and over the first strained layers 106, and replacing the first dummy gate stacks with first metal gate stacks. In some embodiments, the method of forming the intermediate structure in the second region 20 of FIG. 1A includes forming at least two second dummy gate stacks across the fins 102, forming second spacers 204 on the sidewalls of the second dummy gate stacks, forming second strained layers 206 at two sides of each fin 102, forming a second dielectric layer 208 aside the second dummy gate stacks and over the second strained layers 206, and replacing the second dummy gate stacks with second metal gate stacks.

In some embodiments, the first and second dummy gate stacks includes a silicon-containing material, such as polysilicon, amorphous silicon or a combination thereof. In some embodiments, the first and second dummy gate stacks extend in a direction different from (e.g., perpendicular to) the extending direction of the fins 102. In some embodiments, the method of forming the first and second dummy gate stacks includes forming a stacked layer on the substrate 100 and patterning the stacked layer with photolithography and etching processes.

In some embodiments, the first and second spacers 104 and 204 include a nitrogen-containing dielectric material, a carbon-containing dielectric material or both, and the first and second spacers 104 and 204 have a dielectric constant less than about 10, or even less than about 5. In some embodiments, the first and second spacers 104 and 204 includes SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the method of forming the first and second spacers 104 and 204 includes forming a spacer material layer on the substrate 100, and partially removing the spacer material layer by an anisotropic etching process.

In some embodiments, two first strained layers 106 are formed beside each of the first dummy gate stacks, and one of the first strained layers 106 is between the adjacent first dummy gate stacks. In some embodiments, two second strained layers 206 are formed beside each of the second dummy gate stacks, and one of the second strained layers 206 is between the adjacent second dummy gate stacks. In some embodiments, the first and second strained layers 106 and 206 include silicon germanium (SiGe) for a P-type FinFET device. In alternative embodiments, the first and second strained layers 106 and 206 include silicon carbon (SiC), silicon phosphate (SiP), SiCP or a SiC/SiP multi-layer structure for an N-type FinFET device. Following the formation of the first and second strained layers 106 and 206, silicide regions may be formed by siliciding the top portions of the first and second strained layers 106 and 206. In some embodiments, the first and second strained layers 106 and 206 may be optionally implanted with a P-type dopant or an N-type dopant as needed. In some embodiments, the method of forming the first and second strained layers 106 and 206 includes forming recesses in the fins 102, and growing epitaxy layers from the recesses. In some embodiments, the first and second strained layers 106 and 206 can be referred to as "source/drain regions".

In some embodiments, the first and dielectric layers 108 and 208 include nitride such as silicon nitride, oxide such as silicon oxide, phosphosilicate glass (PSG), borosilicate glass (BSG), boron-doped phosphosilicate glass (BPSG), a combination thereof or the like. In some embodiments, a first stop layer 107 is formed after the step of forming the first strained layers 106 and before the step of forming the first dielectric layer 108, and a second stop layer 207 is formed after the step of forming the second strained layers 206 and before the step of forming the second dielectric layer 208. In some embodiments, the first and second stop layers 107 and 207 include SiN, SiC or the like. In some embodiments, the first and second stop layers 107 and 207 are referred to as "contact etch stop layers (CESLs)". In some embodiments, after the step of forming the first and second strained layers 106 and 206, a stop material layer and a dielectric material layer are formed on the substrate 100 filling gaps between the first dummy gate stacks and between the second dummy gate stacks by a suitable deposition technique such as spin-coating, CVD, flowable CVD, PECVD, ALD, a combination thereof or the like. Thereafter, the stop material layer and the dielectric material layer are planarized by a suitable technique such as CMP, until tops of the first and second dummy gate stacks are exposed. In some embodiments, the top surfaces of the first and second dielectric layers 108 and 208 are substantially level with the top surfaces of the first and second dummy gate stacks.

In some embodiments, the first and second dummy gate stacks are replaced with first and second metal gate stacks. In some embodiments, the first and second dummy gate stacks are removed to form first and second gate trenches in the first and second dielectric layers 108 and 208, and the first and second metal gate stacks are then formed in the first and second gate trenches. In some embodiments, the method of forming the first and second metal gate stacks includes forming a stacked layer with CVD, PVD, plating, or a suitable process, and then performing a CMP process to remove the stacked layer outside of the first and second gate trenches. In some embodiments, the top surfaces of the first and second dielectric layers 108 and 208 are substantially level with the top surfaces of the first and second metal gate stacks or the first and second gate stacks 111 and 211.

In some embodiments, each of the first metal gate stacks includes a first gate dielectric layer 110 and a first metal gate 112 (or called "replacement gate") on the first gate dielectric layer 110, and each of the second metal gate stacks includes a second gate dielectric layer 210 and a second metal gate 212 (or called "replacement gate") on the second gate dielectric layer 210. In some embodiments, the first and second metal gate stacks extend in a direction different from (e.g., perpendicular to) the extending direction of the fins 102. In some embodiments, each of the first gate dielectric layers 110 surrounds the sidewall and bottom of the corresponding first metal gate 112 and on the top and sidewall of each fin 102, and each of the second gate dielectric layers 210 surrounds the sidewall and bottom of the corresponding second metal gate 212 and on the top and sidewall of each fin 102, as shown in FIG. 1A. In some embodiments, interfacial layers such as silicon oxide layers are formed between the fins 102 and the first and second gate dielectric layers 110 and 210.

In some embodiments, each of the first and second gate dielectric layers 110 and 210 includes a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfSiO, a combination thereof, or a suitable material. In alternative embodiments, the first and second gate dielectric layers 110 and 210 can optionally include a silicate such as HfSiO, LaSiO, AlSiO, a combination thereof, or a suitable material.

In some embodiments, each of the first and second metal gates 112 and 212 includes a metal material suitable for forming a metal gate or portion thereof. In some embodiments, each of the first and second metal gates 112 and 212 includes a work function metal layer and a fill metal layer on the work function metal layer. In some embodiments, the work function metal layer is a P-type work function metal layer to provide a gate electrode that properly performs in a P-type FinFET device. The P-type work function metal layer includes TiN, WN, TaN, conductive metal oxide, and/or a suitable material. In alternative embodiments, the work function metal layer is an N-type work function metal layer to provide a gate electrode that properly performs in an N-type FinFET device. The P-type work function metal layer includes TiAl, TiAlN, or TaCN, conductive metal oxide, and/or a suitable material. The fill metal layer includes copper (Cu), aluminum (Al), tungsten (W), or a suitable material. In some embodiments, each of the first and second metal gates 112 and 212 can further include a liner layer, an interface layer, a seed layer, an adhesion layer, a barrier layer, a combination thereof or the like.

The above embodiments in which the similar elements/ layers in the first and second regions 10 and 20 are formed simultaneously are provided for illustration purposes, and are not construed as limiting the present disclosure. In alternative embodiments, the similar elements/layers in the first and second regions 10 and 20 are formed separately upon the process requirements. In other words, the similar elements/layers in the first and second regions 10 and 20 can be formed with different materials, thicknesses, sizes, shapes, and/or properties.

Figure 1B:
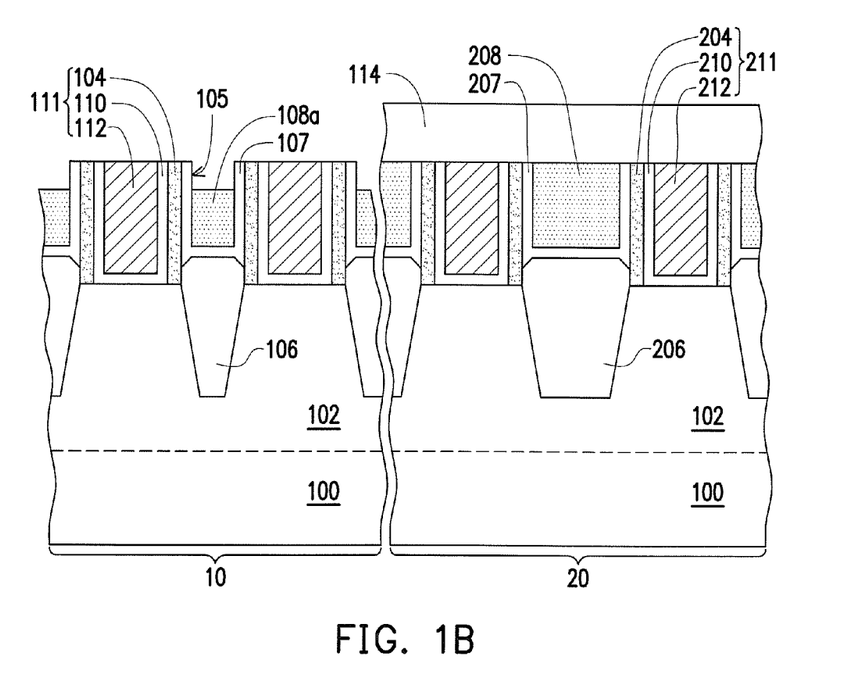

Referring to FIG. 1B, a mask layer 114 is formed to cover the non-target area (e.g., the second dielectric layer 208) and expose the target area (e.g., the first dielectric layer 108). In some embodiment, the mask layer 114 covers the second region 20 and exposes the first region 10. In some embodiment, the mask layer 114 is configured to cover the intended locations of the subsequently formed larger openings, and expose the intended locations of the subsequently formed smaller openings. For example, the mask layer 114 covers the second dielectric layer 208 and exposes the first dielectric layer 108. In some embodiments, the mask layer 114 includes a photoresist layer, and is formed by a photolithography process.

Thereafter, the first dielectric layer 108 is partially removed by using the mask layer 114 as a mask, such that the top surface of the remaining first dielectric layer 108a is lower than the top surface of the second dielectric layer 208. In some embodiments, the partial removal step of the first dielectric layer 108 includes performing an etching back process. In some embodiments, the first dielectric layer 108 is etched at a much quicker rate than the first metal gates 112, the first spacers 104 and the first stop layer 107 during the etching back process. Specifically, the etching back process removes a portion of the first dielectric layer 108, while leaving the first metal gates 112, the first spacers 104 and the first stop layer 107 substantially intact. In some embodiments, the etching back process removes about 20% to about 60% of the thickness of the first dielectric layer 108. Upon the partial removal step of the first dielectric layer 108, a recess 105 is formed between the adjacent first gate stacks 111 and surrounded by the adjacent first spacers 104 and the first dielectric layer 108a. In some embodiments, an upper portion of the first stop layer 107 is exposed by the recess 105. The mask layer 114 is then removed.

Figure 1C:
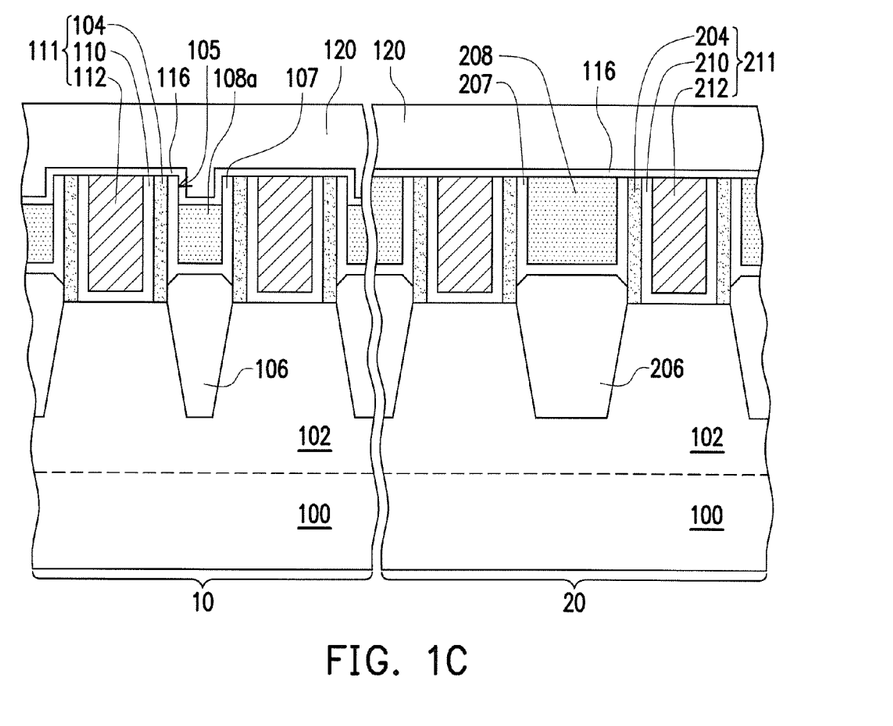

Referring to FIG. 1C, a shielding layer 116 is formed on the substrate 100 in the first and second regions 10 and 20, covering the surfaces of the recesses 105. In some embodiments, the shielding layer 116 is configured to protect the first and second metal gates 112 and 212 from being damaged during the following contact hole defining step. In some embodiments, the shielding layer 116 serves as a gate protection layer, so the conventional cap layer or hard mask layer is not included in each of the first and second gate stacks 111 and 211. In some embodiments, the shielding layer 116 is blanket-formed on the first and second gate stacks 111 and 211 and on the first and second dielectric layer 108a and 208. Specifically, the shielding layer 116 is formed in physical contact with the first and second metal gates 112 and 212, the first and second spacers 104 and 204, and the first and second dielectric layer 108a and 208. In some embodiments, the shielding layer 116 is in physical contact with the first and second gate dielectric layers 110 and 210, as shown in FIG. 1B. In alternative embodiments, the shielding layer 116 is not in physical contact with the first and second gate dielectric layers 110 and 210.

In some embodiments, the shielding layer 116 includes SiN, SiC, SiCN, SiON, SiCON, a combination thereof or the like, and is formed by a suitable deposition technique such as chemical vapor deposition (CVD), plasma-enhanced CVD (PECVD), atomic layer deposition (ALD), remote plasma ALD (RPALD), plasma-enhanced ALD (PEALD), a combination thereof or the like. In some embodiments, the shielding layer 116 has a thickness of about 5 angstroms to 100 angstroms.

Thereafter, a third dielectric layer 120 is formed on the shielding layer 116. In some embodiments, the third dielectric layer 120 is blanket-formed on the shielding layer 116 in the first and second regions 10 and 20. In some embodiments, the third dielectric layer 120 includes a material the same as that of the first and second dielectric layers 108a and 208. In alternative embodiments, the first, second and third dielectric layers 108a, 208 and 120 are made by different materials. In some embodiments, the third dielectric layer 120 includes nitride such as silicon nitride, oxide such as silicon oxide, PSG, BSG, BPSG, a combination thereof or the like, and is formed by a suitable deposition technique such as spin-coating, CVD, flowable CVD, PECVD, ALD, a combination thereof or the like.

Figure 1D:
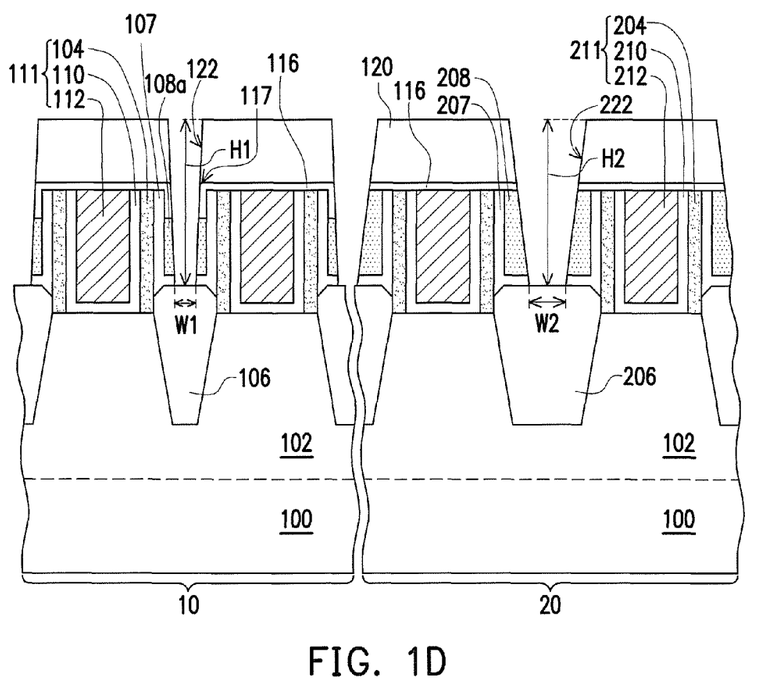

Referring to FIG. 1D, the third dielectric layer 120, the shielding layer 116, the first and second dielectric layer 108a and 208, and the first and second stop layers 107 and 207 are patterned or partially removed, so as to form first openings 122 (or called "contact holes") corresponding to the first strained layers 106 in the first region 10 and form second openings 222 (or called "contact holes") corresponding to the second strained layers 206 in the second region 20. In some embodiments, the patterning step includes performing an etching process.

In some embodiments, after the third dielectric layer 120 is formed, a hard mask layer with multiple varied openings is formed on the third dielectric layer 120. In some embodiments, the openings of the hard mask layer correspond to the intended locations of the subsequently formed contact holes. In some embodiments, the hard mask layer includes a photoresist material, a dielectric material or a combination thereof, and is formed by a CVD, ALD, spin coating, a combination thereof or the like. Thereafter, portions of the third dielectric layer 120, the shielding layer 116, the first and second dielectric layer 108a and 208, and the first and second stop layers 107 and 207 are removed by using the hard mask layer as an etch mask.

In some embodiments, each of the first openings 122 penetrates through the third dielectric layer 120, the shielding layer 116, the first dielectric layer 108a and the first stop layer 107 and exposes the corresponding first strained layer 106, and each of the second openings 222 penetrates through the third dielectric layer 120, the shielding layer 116, the second dielectric layer 208 and the second stop layer 207 and exposes the corresponding second strained layer 206. In some embodiments, the first and second openings 122 and 222 have tilted sidewalls, as shown in FIG. 1D. In alternative embodiments, at least some of the first and second openings 122 and 222 have substantially vertical sidewalls. Besides, the shape of the first and second openings 122 and 222 can be circular, oval, square, rectangular, strip, polygonal or any shape as needed.

In some embodiments, the aspect ratio of the first openings 122 is greater than the aspect ratio of the second openings 222. In some embodiments, the aspect ratio of an opening is defined as the ratio of the longest side to the shortest side. For example, the aspect ratio of an opening is defined as the ratio of the height to the width. In some embodiments, the aspect ratio (height H1/width W1) of the first openings 122 is in a range from about 1 to 20.

In some embodiments, the dimension (e.g., width) of the second openings 222 is greater than the dimension (e.g., width) of the first openings 122. In some embodiments, the width W2 of the second openings 222 is at least about 1.5 times, 2 times or even 20 times greater than the width W1 of the first openings 122.

Figure 1E:
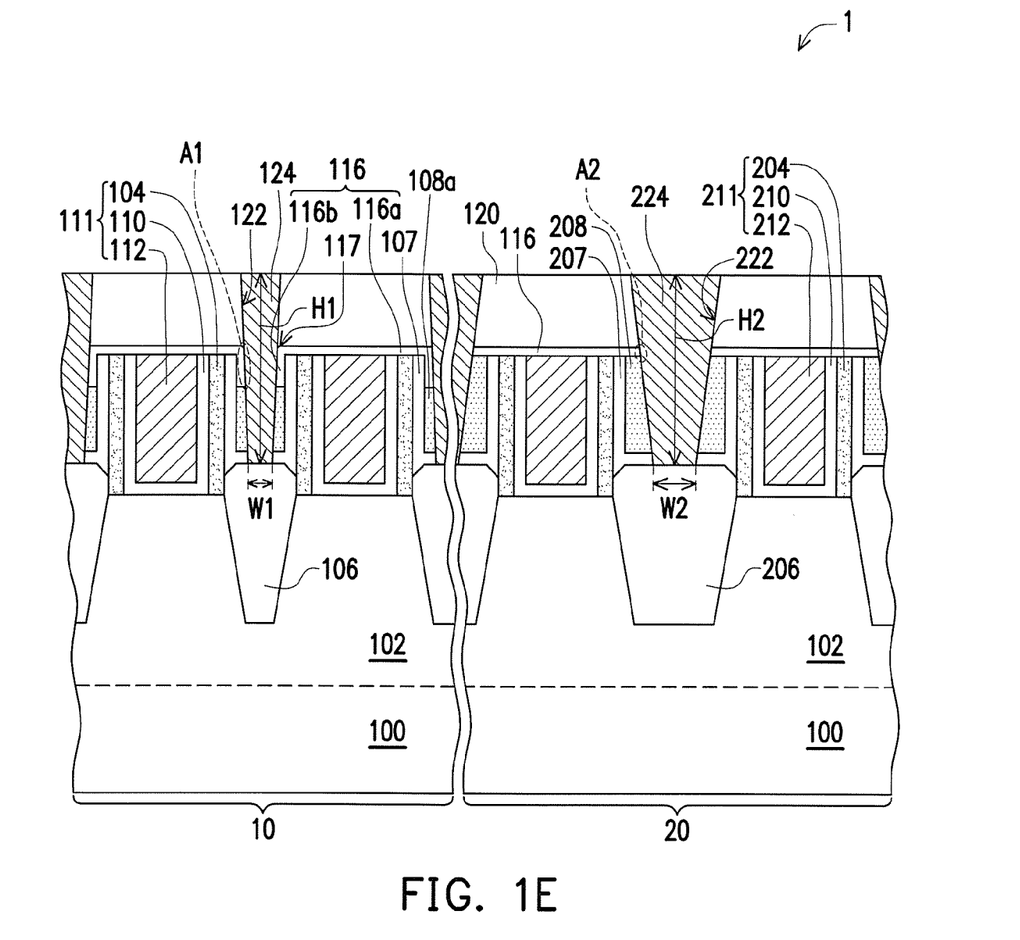

Referring to FIG. 1E, first connectors 124 are formed in the first openings 122, and the second connectors 224 are formed in the second openings 222. In some embodiments, the first and second connectors 124 and 224 are intended to represent any type of conductive materials and structures that are electrically connected to the first and second strained layers 106 and 206. In some embodiments, the first connectors 124 are formed through the third dielectric layer 120, the shielding layer 116, the first dielectric layer 108a and the first stop layer 107 and are electrically connected to the first strained layers 106, and the second connectors 224 are formed through the third dielectric layer 120, the shielding layer 116, the second dielectric layer 208 and the second stop layer 207 and are electrically connected to the second strained layers 206.

In some embodiments, the first and second connectors 124 and 224 include metal, such as tungsten, copper, an alloy thereof or any metal material with suitable resistance and gap-fill capability. In some embodiments, a metal material layer is formed on the substrate 100 filling in the first and second openings 122 and 222 by sputtering, CVD, electrochemical plating (ECP), a combination thereof or the like. A planarization step such as CMP is then performed to remove a portion of the metal material layer until the top of the third dielectric layer 120 is exposed. In some embodiments, the tops of the first and second connectors 124 and 224 are substantially coplanar with the top of the third dielectric layer 120. A FinFET device 1 is thus completed.

When a device is provided with a smaller contact and a larger contact, the process window for the smaller one is usually narrower than that for the larger one due to the micro-loading effect or aspect-ratio dependent etching (ARDE) effect. Therefore, when contact holes with different sizes are defined by the conventional method, over-etching for the larger contact hole and/or poor profile for the smaller contact hole usually occur. However, such issues are not observed in the disclosure. Specifically, in some embodiments, one dielectric layer is partially etched in the smaller contact region while not etched in the larger contact region, a shielding layer and another dielectric layer are formed over the one dielectric layer, and the film stack is subjected to the contact hole etching step. By such disposition, the film stack in the larger contact region can be etched at a rate substantially the same as that in the smaller contact region, so both of the smaller and larger contact holes can be provided with better etching profiles, and therefore both of the smaller and larger contacts can be formed with improved properties.

Figure 2:
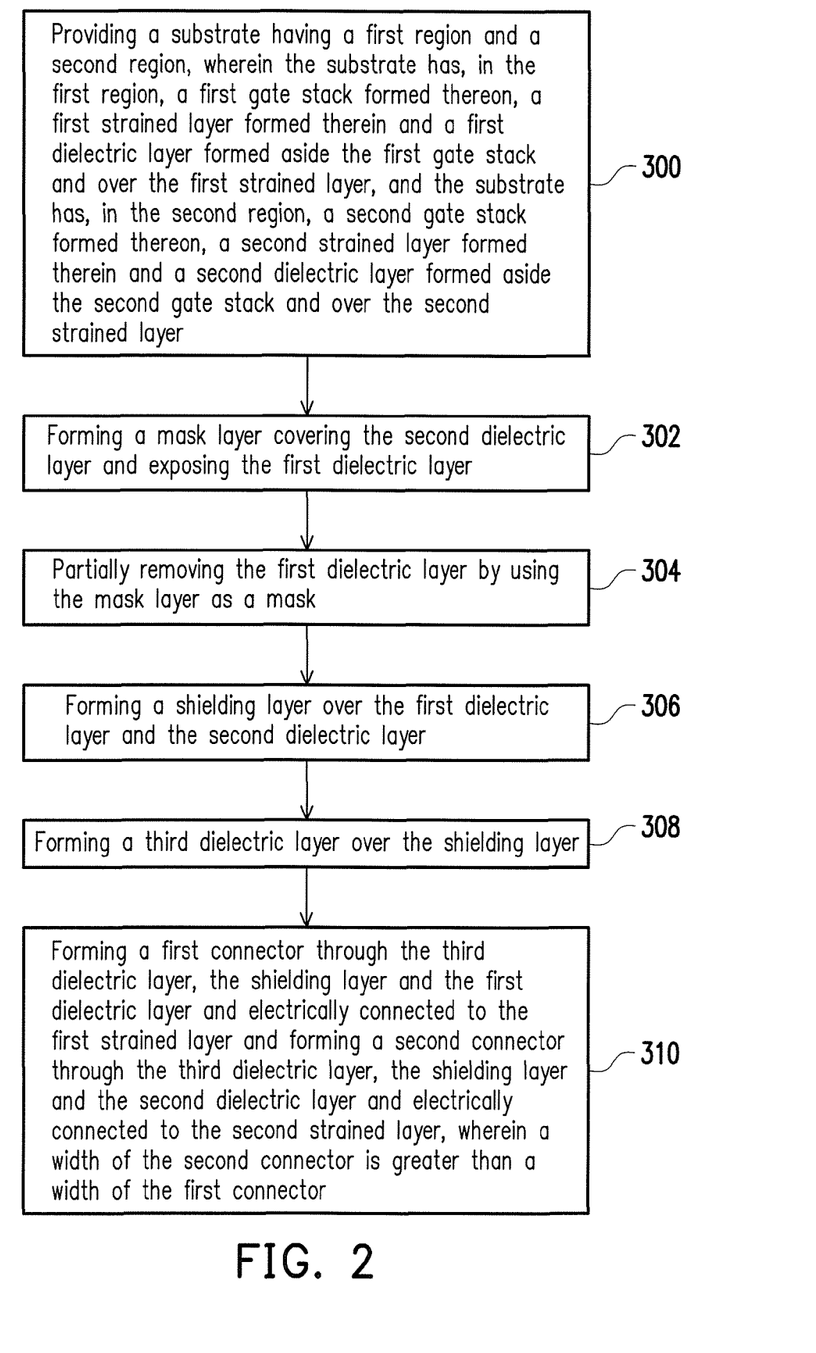
FIG. 2 is a flow chart of a method of forming a FinFET device in accordance with some embodiments.

The above-mentioned process steps in FIG. 1A-1E can be concisely illustrated with reference to the flow chart of FIG. 2.

At step 300, a substrate 100 is provide with a first region 10 and a second region 20, wherein the substrate 100 has, in the first region 10, a first gate stack 111 formed thereon, a first strained layer 106 formed therein and a first dielectric layer 108a formed aside the first gate stack 111 and over the first strained layer 106, and the substrate 100 has, in the second region 20, a second gate stack 211 formed thereon, a second strained layer 206 formed therein and a second dielectric layer 208 formed aside the second gate stack 211 and over the second strained layer 206, as shown in FIG. 1A. In some embodiments, the pitch P1 in the first region 10 is smaller than the pitch P2 in the second region 20.

At step 302, a mask layer 114 is formed to cover the second dielectric layer 208 and expose the first dielectric layer 108, as shown in FIG. 1B. At step 304, the first dielectric layer 108 is partially removed by using the mask layer 114 as a mask, as shown in FIG. 1B. In some embodiments, the partial removal step is an etching back process. Upon the partial removal step, the top surface of first dielectric layer 108a is lower than that of second dielectric layer 208. The mask layer 114 is then removed.

At step 306, a shielding layer 106 is formed over the first dielectric layer 108a and the second dielectric layer 208, as shown in FIG. 1C. At step 308, a third dielectric layer 120 is formed over the shielding layer 116, as shown in FIG. 1C.

At step 310, a first connector 124 is formed through the third dielectric layer 120, the shielding layer 106 and the first dielectric layer 108a and is electrically connected to the first strained layer 106, and a second connector 224 is formed through the third dielectric layer 120, the shielding layer 106 and the second dielectric layer 208 and is electrically connected to the second strained layer 206, wherein the width W2 of the second connector 224 is greater than the width W1 of the first connector 124, as shown in FIG. 1D and FIG. 1E. The FinFET device of the disclosure is thus completed with the described process steps. However, it is not limited to add one or more additional steps among the above steps for fabricating the FinFET device.

In some embodiments, the FinFET device of the disclosure includes a substrate 100 having at least one fin 102, first and second gate stacks 111 and 211, first and second strained layers 106 and 206, first and second dielectric layers 108a and 208, and first and second connectors 124 and 224. The first and second gate stacks 111 and 211 are across the at least one fin 102. The first and second strained layers 106 and 206 are respectively aside the first and second gate stacks 111 and 211. The first and second dielectric layer 108a and 208 are respectively over the first and second strained layer 106 and 206. Besides, the top surface of the first dielectric layer 108a is lower than the top surface of the second dielectric layer 208. In some embodiments, the top surfaces of the second dielectric layer 208, the second gate stack 211 and the first gate stack 111 are substantially coplanar and at a level higher than the top surface of the first dielectric layer 108a.

The first connector 124 is through the first dielectric layer 108a and is electrically connected to the first strained layer 106. The second connector 224 is through the second dielectric layer 208 and is electrically connected to the second strained layer 206. Besides, the width W2 of the second connector 224 is greater than the width W1 of the first connector 124. In some embodiments, the width W2 of the second connector 224 is at least about 1.5 times greater than the width W1 of the first connector 124. In some embodiments, the aspect ratio of the first connector 124 is greater than about 3.

In some embodiments, a shielding layer 116 and a third dielectric layer 120 are further included in the FinFET device of the disclosure. The shielding layer 116 is over the first and second gate stacks 111 and 211 and over the first dielectric layer 108a and the second dielectric layer 208. The third dielectric layer 120 is over the shielding layer 116. The first and second connectors 124 and 224 are further through the shielding layer 116 and the third dielectric layer 120. In some embodiments, the shielding layer 116 includes SiN, SiC, SiCN, SiON, SiCON or a combination thereof. In some embodiments, the shielding layer 116 includes a material having an etching rate different from that of the first dielectric layer 108a, the second dielectric layer 208 or the third dielectric layer 120.

In some embodiments, the shielding layer 116 in the first region 10 has a turning point 117 in contact with the adjacent first connector 124. Specifically, the shielding layer 116 in the first region 10 includes a first shielding part 116a and a second shielding part 116b connected to each other at the turning point 117, wherein the first shielding part 116a is in contact with the first metal gate 112 of the first gate stack 111 and the second shielding part 116b is in contact with the adjacent first connector 124, as shown in FIG. 1E. In some embodiments, the shielding layer 116 in the first region 10 has a reverse U-shape in cross-section, and the reverse U-shape shielding layer serves as a gate protection mask to protect the first metal gate 112 from being damaged during the contact hole defining step.

In some embodiments, the shielding layer 116 in the second region 20 extends in a lateral direction and has a horizontal I-shaped in cross-section. The horizontal I-shaped shielding layer serves as a gate protection mask to protect the second metal gate 212 from being damaged during the contact hole defining step.

Figure 3:
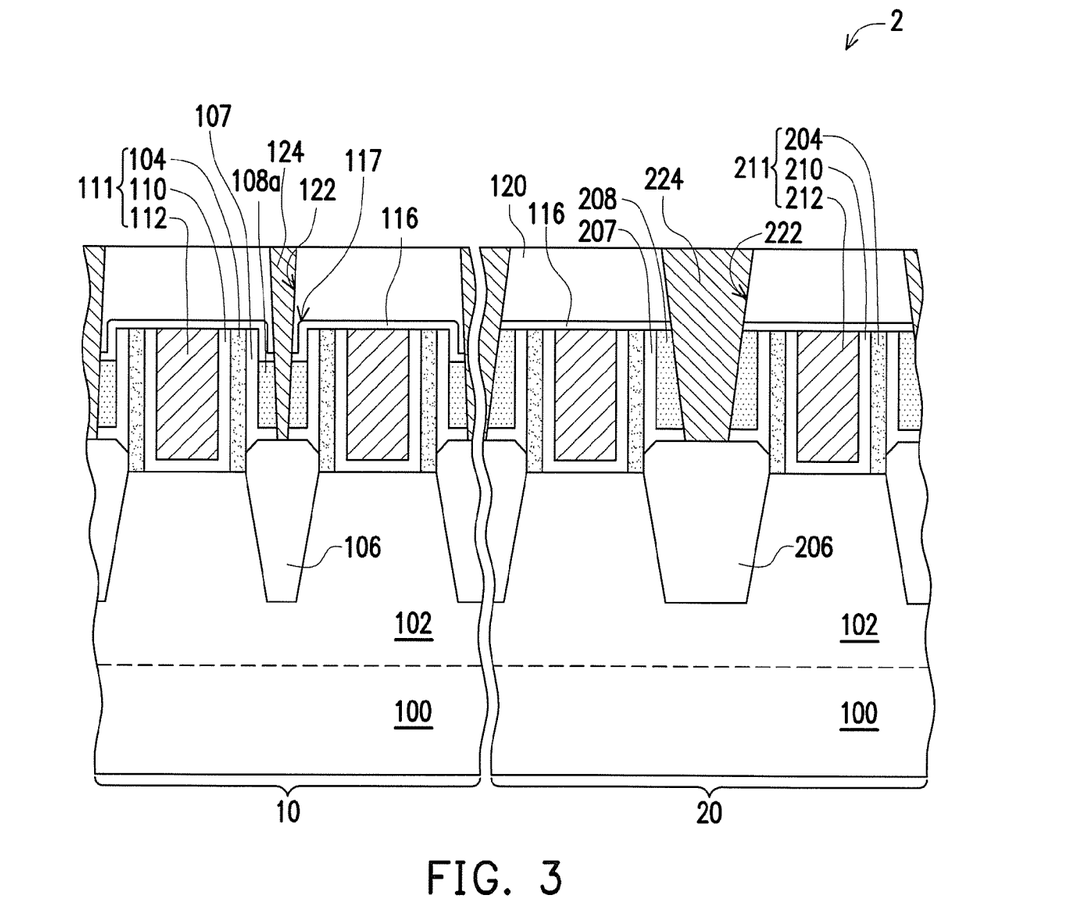
FIG. 3 is a schematic cross-sectional view of a FinFET device in accordance with alternative embodiments.

From another point of view, the shielding layer 116 is formed across the first and second regions 10 and 20 and has a mesh structure, the first and second connectors 124 and 224 are formed through the mesh holes (e.g., first and second openings 122 and 222) of the mesh structure. In some embodiments, the shielding layer 116 is in "surface contact" with the first connector 124 while in "point contact" with the second connector 224, as shown in FIG. 1E. Specifically, the contact area A1 between the shielding layer 116 and the first connector 124 is greater than the contact area A2 between the shielding layer 116 and the second connector 224. However, the disclosure is not limited thereto. In alternative embodiments, the shielding layer 116 is in point contact with each of the first connector 124 and the second connector 224, as shown in FIG. 3.

The above embodiments in which each of the gate dielectric layers, the metal gates, the spacers, the first to third dielectric layers, the shielding layer, and the connectors is a single layer are provided for illustration purposes, and are not construed as limiting the present disclosure. In some embodiments, at least one of these described elements can be a multi-layer structure as needed.

In the above-mentioned embodiments, a "gate last" process is implemented to form a FinFET device. However, another process such as a "gate first" process or another type of device (e.g., planar device) can be applied by using similar processes as described herein. The methods disclosed herein can be easily integrated with a CMOS process flow and do not require additional complicated steps to achieve the desired results. It is understood that embodiments disclosed herein offer different advantages, and that no particular advantage is necessarily required for all embodiments.

In view of the above, in some embodiments, one dielectric layer is partially etched in a high pattern density region (e.g., a smaller contact region) while not etched in a low pattern density region (e.g., a larger contact region), a shielding layer and another dielectric layer are formed over the one dielectric layer, and the resulting film stack is subjected to the contact hole etching step. By such disposition, the conventional micro-loading effect or aspect-ratio dependent etching (ARDE) effect can be mitigated, so the film stack in the larger contact region can be etched at a rate substantially the same as that in the smaller contact region. Accordingly, the contact holes and therefore contacts with different sizes can be provided with improved etching profiles and properties.

Besides, in the high pattern density region, the shielding layer is in "surface contact" with (rather than in "point contact" with) the smaller contact/connector, so wider lithography/etching process window, less lithography overlay requirement, better channel isolation, and greater contact-to-gate distance are gained. Therefore, the conventional metal gate damage is not observed, and the performance and reliability of the device are accordingly improved.

In accordance with some embodiments of the present disclosure, a FinFET device includes a substrate having at least one fin, first and second gate stacks, first and second strained layers, first and second dielectric layers, and first and second connectors. The first and second gate stacks are across the at least one fin. The first strained layer is aside the first gate stack and the second strained layer is aside the second gate stack. The first dielectric layer is over the first strained layer, the second dielectric layer is over the second strained layer, and the top surface of the first dielectric layer is lower than the top surface of the second dielectric layer. The first connector is through the first dielectric layer and is electrically connected to the first strained layer. The second connector is through the second dielectric layer and is electrically connected to the second strained layer. Besides, a width of the second connector is greater than a width of the first connector.

In accordance with alternative embodiments of the present disclosure, a FinFET device includes a substrate having at least one fin, first and second gate stacks, first and second strained layers and first and second connectors. The first and second gate stacks are across the at least one fin. The first strained layer is aside the first gate stack and the second strained layer is aside the second gate stack. The first connector is electrically connected to the first strained layer, the second connector is electrically connected to the second strained layer, and a width of the second connector is greater than a width of the first connector. The shielding layer is in physical contact with the first connector and the second connector, and the contact area between the shielding layer and the first connector is greater than the contact area between the shielding layer and the second connector.

In accordance with yet alternative embodiments of the present disclosure a method of forming a FinFET device including the following steps. A substrate is provided with a first region and a second region, wherein the substrate has, in the first region, a first gate stack formed thereon, a first strained layer formed therein and a first dielectric layer formed aside the first gate stack and over the first strained layer, and the substrate has, in the second region, a second gate stack formed thereon, a second strained layer formed therein and a second dielectric layer formed aside the second gate stack and over the second strained layer. A mask layer is formed to cover the second dielectric layer and expose the first dielectric layer. The first dielectric layer is partially removed by using the mask layer as a mask. A first connector is formed through the first dielectric layer and is electrically connected to the first strained layer, and a second connector is formed through the second dielectric layer and is electrically connected to the second strained layer. Besides, a width of the second connector is greater than a width of the first connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET device, comprising:
a substrate having at least one fin;
a first gate stack and a second gate stack across the at least one fin;
a first strained layer aside the first gate stack and a second strained layer aside the second gate stack;
a first dielectric layer over the first strained layer and a second dielectric layer over the second strained layer, wherein a top surface of the first dielectric layer is lower than a top surface of the second dielectric layer;
a first connector through the first dielectric layer and electrically connected to the first strained layer; and
a second connector through the second dielectric layer and electrically connected to the second strained layer, wherein a width of the second connector is greater than a width of the first connector.

2. The FinFET device of claim 1, wherein the width of the second connector is at least about 1.5 times greater than the width of the first connector.

3. The FinFET device of claim 1, wherein the top surface of the second dielectric layer is substantially coplanar with a top surface of the second gate stack.

4. The FinFET device of claim 1, wherein an aspect ratio of the first connector is greater than about 3.

5. The FinFET device of claim 1, further comprising:
a shielding layer over the first dielectric layer and the second dielectric layer; and
a third dielectric layer over the shielding layer,
wherein the first connector and the second connector are further through the shielding layer and the third dielectric layer.

6. The FinFET device of claim 5, wherein the shielding layer has a turning point in physical contact with the first connector and laterally extends to contact the second connector.

7. The FinFET device of claim 5, wherein the shielding layer is in physical contact with a first metal gate of the first gate stack and a second metal gate of the second gate stack.

8. The FinFET device of claim 5, wherein the shielding layer comprises SiN, SiC, SiCN, SiON, SiCON or a combination thereof.

9. A FinFET device, comprising:
a substrate having at least one fin;
a first gate stack and a second gate stack across the at least one fin;
a first strained layer aside the first gate stack and a second strained layer aside the second gate stack;
a first connector electrically connected to the first strained layer and a second connector electrically connected to the second strained layer, wherein a width of the second connector is greater than a width of the first connector; and
a shielding layer in physical contact with the first connector and the second connector, wherein a contact area between the shielding layer and the first connector is greater than a contact area between the shielding layer and the second connector.

10. The FinFET device of claim 9, wherein the width of the second connector is at least about 1.5 times greater than the width of the first connector.

11. The FinFET device of claim 9, wherein an aspect ratio of the first connector is greater than about 3.

12. The FinFET device of claim 9, further comprising:
a first dielectric layer between the first gate stack and the first connector; and
a second dielectric layer between the second gate stack and the second connector, wherein a top surface of the first dielectric layer is lower than a top surface of the second dielectric layer and wherein the first connector is through the first dielectric layer and the second connector is through the second dielectric layer.

13. The FinFET device of claim 12, wherein the top surface of the second dielectric layer is substantially coplanar with a top surface of the second gate stack.

14. The FinFET device of claim 9, wherein the shielding layer is in physical contact with a first metal gate of the first gate stack and a second metal gate of the second gate stack.

15. The FinFET device of claim 9, wherein the shielding layer comprises SiN, SiC, SiCN, SiON, SiCON or a combination thereof.

16. A method of forming a FinFET device, comprising:
providing a substrate having a first region and a second region, wherein the substrate has, in the first region, a first gate stack formed thereon, a first strained layer formed therein and a first dielectric layer formed aside the first gate stack and over the first strained layer, and the substrate has, in the second region, a second gate stack formed thereon, a second strained layer formed therein and a second dielectric layer formed aside the second gate stack and over the second strained layer;
forming a mask layer covering the second dielectric layer and exposing the first dielectric layer;
partially removing the first dielectric layer by using the mask layer as a mask; and
forming a first connector through the first dielectric layer and electrically connected to the first strained layer and forming a second connector through the second dielectric layer and electrically connected to the second strained layer, wherein a width of the second connector is greater than a width of the first connector.

17. The method of claim 16, further comprising, after the step of partially removing the first dielectric layer and before the step of forming the first connector and the second connector:
forming a shielding layer over the first dielectric layer and the second dielectric layer; and
forming a third dielectric layer over the shielding layer, wherein the first connector and the second connector are further formed through the shielding layer and the third dielectric layer.

18. The method of claim 17, wherein a contact area between the shielding layer and the first connector is greater than a contact area between the shielding layer and the second connector.

19. The method of claim 17, wherein the shielding layer has a turning point in physical contact with the first connector and laterally extends to contact the second connector.

20. The method of claim 16, wherein the width of the second connector is at least about 1.5 times greater than the width of the first connector.

* * * * *